United States Patent [19]

Eberhard

[11] 3,735,155

[45] May 22, 1973

[54] INTEGRATED BISTABLE STAGE HAVING MOS FIELD EFFECT TRANSISTORS

[75] Inventor: Gunther Eberhard, Munich 80, Germany

[73] Assignee: Siemens Aktiengesellschaft, Berlin and Munich, Germany

[22] Filed: Feb. 7, 1972

[21] Appl. No.: 224,182

[30] Foreign Application Priority Data

Mar. 16, 1971 Germany....................P 21 12 481.2

[52] U.S. Cl. ....................307/279, 307/238, 307/251

[51] Int. Cl...............................................H03k 3/286

[58] Field of Search.......................307/238, 251, 279

[56] References Cited

UNITED STATES PATENTS

| | | | |
|---|---|---|---|
| R27,305 | 3/1972 | Polkinghorn et al. | 307/251 |
| 3,593,037 | 7/1971 | Hoff | 307/238 |
| 3,618,053 | 11/1971 | Hudson | 307/238 X |
| 3,691,537 | 9/1972 | Burgess et al. | 307/279 X |

*Primary Examiner*—John S. Heyman
*Attorney*—Arthur E. Wilfond, Herbert L. Lerner and Daniel J. Tick

[57] ABSTRACT

A bistable stage in an integrated circuit has two inverter stages connected in series. Each of the inverter stages comprises an MOS-FET and a load capacitor. The inverter stages have a timed supply potential. The first inverter stage is controlled via the storage capacitor and controls the second inverter stage which is itself connected via an additional MOS-FET to the storage capacitor of the timed supply potential thereby maintaining the storage condition.

1 Claim, 1 Drawing Figure

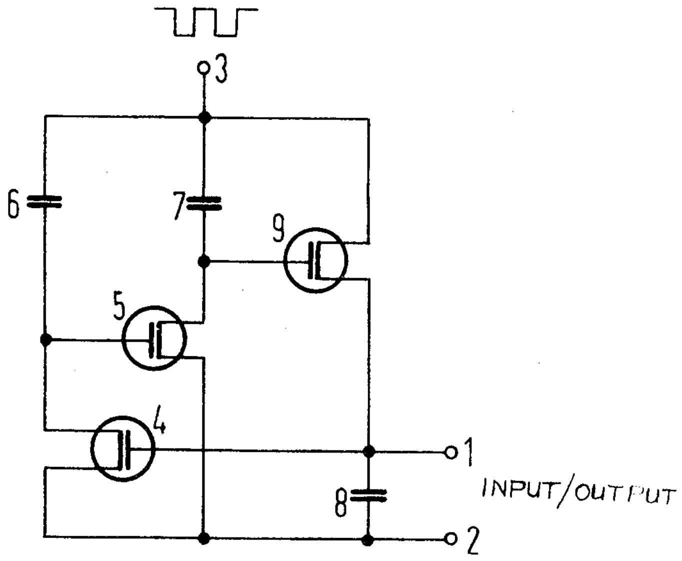
3
6
7
9
5
4
1
INPUT/OUTPUT
8
2

INTEGRATED BISTABLE STAGE HAVING MOS FIELD EFFECT TRANSISTORS

DESCRIPTION OF THE INVENTION

The present invention relates to an integrated bistable stage having MOS field effect transistors. More particularly, the invention relates to two inverter stages comprising MOS-FETs.

This type of circuit device is known and disclosed in "Electronics Design" Vol. 7, Apr. 1, 1967, pages 62 to 67. To obtain or transmit digital information, basically two inversions of the information content are used which are produced with the aid of two inverter stages. The inverter stages comprise at least two MOS field effect transistors or MOS-FET. One of the MOS field effect transistors functions as a controlled load resistance. Control is effected according to the so-called two or four-phase technique. This means that the inverter stages carry out the required inversion according to a rather complicated control which follows in time sequence, especially when each inverter stage is provided with an additional controlled MOS-FET which has the function of preventing a static flow of direct current. Altogether, this involves a considerable number of active components and the need to control such components.

An object of the invention is to provide an MOS-FET bistable stage which overcomes the disadvantages of known similar stages.

Another object of the invention is to provide an MOS-FET bistable stage which is of simple structure, utilizes few active components and has a low power consumption.

Still another object of the invention is to provide an MOS-FET bistable stage which functions with efficiency, effectiveness and reliability.

To accomplish this and in accordance with the invention, a bistable stage of a circuit arrangement has an input comprising two input terminals which is also the output. Two inverter stages are connected between a source of reference potential and a terminal which provides a timed supply potential. Each of the inverter stages comprises a series connection of the current path of an MOS-FET and a load capacitor. The load capacitors are connected to the supply potential terminal. A storage capacitor is connected in parallel with the input terminals. The current path of a third MOS-FET is connected between the storage capacitor and the supply potential terminal. The other input terminal is connected to the control electrode of the MOS-FET of the first inverter stage. A common point in the connection between the MOS-FET of the first inverter stage and the load capacitor thereof is connected to the control electrode of the MOS-FET of the second inverter stage. A common point in the connection between the MOS-FET of the second inverter stage and the load capacitor thereof is connected to the control electrode of the third MOS-FET.

The bistable stage of the invention requires a minimum number of active components and a minimum control of said components. All the active components may have low ohmic resistance. This provides the integrated circuit with a smaller space requirement and better operating speed. One single pulse signal is required for the operation of the bistable stage.

The inverter stages in accordance with the invention are basically known and described, for example, in "Electronics Letters", May 17, 1968, Vol. 4, No. 10, pages 199 and 200. A load resistance is connected in series to an MOS-FET, so that a capacitor is utilized rather than an MOS-FET. The capacitor complies much better than an MOS-FET with the requirement that, during the transitional period of the control pulse, the load resistance must have the lowest possible value and in a stationary condition the highest possible value. The output of rest losses is smaller. Compared to the MOS-FET used as a controlled load resistance, the load capacitor is controlled by the applied supply potential. That is, instead of a constant potential, a timed supply potential must be applied. To accomplish this, a pulse is transmitted to a storage capacitor connected in parallel with the MOS-FET, depending on whether the MOS-FET is conductive or non-conductive. This results in the inversion of the signal occurring at the control electrode of the MOS-FET.

In accordance with the invention, two such inverter stages are interconnected with an additional or third MOS-FET in a bistable stage.

In order that the invention may be readily carried into effect, it will now be described with reference to the accompanying drawing, wherein the single FIGURE is a circuit diagram of an embodiment of the bistable stage of the invention.

The input of the bistable stage, which is an integrated circuit, comprises two input terminals 1 and 2. One of the input terminals 1 and 2 comprises a source of reference potential. The input simultaneously functions as the output of the bistable stage. A storage capacitor 8 is connected in parallel with the input terminals 1 and 2.

Two inverter stages are connected between the source of reference potential and a supply potential terminal 3 which provides a timed supply potential. The first inverter stage comprises the current path of a first MOS-FET 4 connected in series circuit arrangement with a first load capacitor 6. The second inverter stage comprises the current path of a second MOS-FET 5 connected in series circuit arrangement with a second load capacitor 7. The load capacitors 6 and 7 are connected to the source of supply potential 3.

The control electrode of the MOS-FET 4 is connected to the terminal 1. A common point in the connection between the MOS-FET 4 and the load capacitor 6 is connected to the control electrode of the MOS-FET 5. A common point in the connection between the MOS-FET 5 and the load capacitor 7 is connected to the control electrode of a third MOS-FET 9. The current path of the third MOS-FET 9 is connected between the terminals 1 and 3.

When such a bistable stage is used as a storage cell, for example, a logical information is stored in the storage capacitor 8 as the input. This information is transmitted to the control electrode of the MOS-FET 9 and renewed in the storage capacitor 8 by each time pulse of the timed supply potential at the terminal 3. If, for example, a logical "1" is stored in the storage capacitor 8, the first MOS-FET 4 is conductive but, as a result, the second MOS-FET 5 is non-conductive.

The time pulses are transmitted via the load capacitors 6 and 7. In this case, the time pulses are transmitted via the first load capacitor 6 toward the reference potential and via the second load capacitor 7 to the control electrode of the third MOS-FET 9, since the second MOS-FET 5 is non-conductive. As a result, the third MOS-FET 9 is conductive at each time pulse of the supply potential at the source 3, so that the time pulse reaches the storage capacitor 8 and is able to maintain its load condition, meaning logical "1".

The first MOS-FET 4 is switched to its non-conductive condition when logical "0" is stored in the storage capacitor 8 and the second MOS-FET 5 is conductive at each time pulse so that the third MOS-FET 9 remains in its non-conductive condition. The reading of the information stored in storage capacitor 8 occurs simultaneously with a time pulse. This provides an adequately high load current via the low ohmic current path of the third MOS-FET 9.

While the invention has been described by means of a specific example and in a specific embodiment, it should not be limited thereto, for obvious modifications will occur to those skilled in the art without departing from the spirit and scope of the invention.

I claim:

1. An integrated bistable stage, comprising
an input having two input terminals functions simultaneously as the output;
reference potential means for applying a reference potential to one of the input terminals;
supply potential means for providing a timed supply potential;
first and second inverter stages connected between the one of the input terminals and the supply potential means, the first inverter stage comprising a first MOS-FET having a current path connected in series circuit arrangement with a first load capacitor, the second inverter stage comprising a second MOS-FET having a current path connected in series circuit arrangement with a second load capacitor, the firs and second load capacitors being connected to the supply potential means, the other of the input terminals being connected to the control electrode of the first MOS-FET and means connecting a common point in the connection between the first MOS-FET and the first load capacitor to the control electrode of the second MOS-FET;
a storage capacitor connected in parallel with the input terminals;
a third MOS-FET having a current path connected between the storage capacitor and the supply potential means; and
means connecting a common point in the connection between the second MOS-FET and the second load capacitor to the control electrode of the third MOS-FET.

* * * * *